US006936124B2

(12) United States Patent
Matsuzawa et al.

(10) Patent No.: US 6,936,124 B2
(45) Date of Patent: Aug. 30, 2005

(54) WIRE JOINT DETECTING APPARATUS

(75) Inventors: Susumu Matsuzawa, Iwate-gun (JP); Tomiyuki Takeda, Iwate-gun (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 428 days.

(21) Appl. No.: 10/268,492

(22) Filed: Oct. 9, 2002

(65) Prior Publication Data

US 2003/0034461 A1 Feb. 20, 2003

Related U.S. Application Data

(62) Division of application No. 09/632,963, filed on Aug. 4, 2000, now Pat. No. 6,685,786.

(30) Foreign Application Priority Data

Aug. 10, 1999 (JP) ........................................ 11-226124
Aug. 10, 1999 (JP) ........................................ 11-226130
Jul. 17, 2000 (JP) ...................................... 2000-216193

(51) Int. Cl.$^{7}$ ........................ G01N 19/02; B23Q 17/09; G01R 27/26

(52) U.S. Cl. .......................... 156/157; 73/104; 324/662

(58) Field of Search ................................ 156/157–158; 73/827, 104–105, 829; 324/662; 29/857, 872

(56) References Cited

U.S. PATENT DOCUMENTS 2,279,300 A 4/1942 Cavanagh .................. 156/158
4,078,202 A * 3/1978 Nishi et al. ................ 324/662
4,348,805 A 9/1982 Gibbons ...................... 29/857

FOREIGN PATENT DOCUMENTS

| | | | | |
|---|---|---|---|---|
| DE | 31 44281 | | 5/1983 | |
| JP | 05345324 A | * | 12/1993 | .......... B29C/35/10 |
| JP | 6-24319 | | 9/1994 | |
| JP | 07014446 A | * | 1/1995 | .......... H01B/13/00 |
| JP | 7-14444 | | 6/1995 | |
| JP | 8-78128 | | 3/1996 | |
| JP | 8-138824 | | 5/1996 | |
| JP | 9-298820 | | 11/1997 | |
| JP | 9-306626 | | 11/1997 | |
| JP | 10003979 A | * | 1/1998 | ......... H01R/43/052 |
| JP | 10-92236 | | 4/1998 | |
| JP | 11-67286 | | 6/1999 | |

* cited by examiner

*Primary Examiner*—Hezron Williams
*Assistant Examiner*—Tamiko Bellamy
(74) *Attorney, Agent, or Firm*—Gerald E. Hespos; Anthony J. Casella

(57) ABSTRACT

A wire joint detecting apparatus is provided for use with a wire connecting apparatus. A detecting apparatus includes a detector disposed for sliding contact with a running wire. The detector is mounted for pivotal movement in response to cross-sectional dimensional changes of the wire. The apparatus also includes a detection switch for detecting pivotal movement of the detector. The pivotal movement of the detector is indicative of a cross-sectional dimensional change of the wire that indicates the presence of a joint.

4 Claims, 21 Drawing Sheets

WIRE JOINT DETECTING APPARATUS

This application is a divisional of U.S. patent application Ser. No. 09/632,963, filed Aug. 4, 2000 now U.S. Pat. No. 6,685,786.

BACKGROUND OF THE INVENTION

1. Field of the Invention

The present invention relates to a method and apparatus for connecting a wire from an existing wire supply to a wire from a new wire supply during manufacturing of a wiring harness. The invention also relates to a method and apparatus for detecting a wire joint.

2. Description of the Related Art

A prior art wiring harness requires a plurality of wires of a specified lengths. The wires are drawn from a plurality of wire supplies to a cutting/mounting apparatus where the respective wires are cut to the specified lengths. Terminals then are crimped or otherwise connected to the cut ends of the wires. It is often necessary to change the wire that is being processed. To make this change, the wire drawn from a first wire supply is cut. A wire from a second wire supply then is connected with the cut end to enable a continued production of the wiring harness.

Several wire connection methods have been known and/or used in the prior art. One prior art wire connection method inserts the ends of the wires into a sleeve and compresses the sleeve to connect the wire ends. However, the compression force or the crimping force of the sleeve sometimes is insufficient. Accordingly the reliability of this connection method is low. Additionally, the sleeve is expensive.

A second prior art wire connection method welds the wire ends together, as disclosed in Japanese Unexamined Patent Publication No. 8-138824. However, this prior art method is expensive, and the finishing of the joint portion is unstable. More particularly, burrs and/or flash may be formed. Flash, in particular, may disadvantageously clog the nozzle through which the wire is fed.

A third prior art wire connection method successively feeds crimping pieces by a strip, positions the wire ends to be connected on the crimping piece along a straight line, crimps the crimping piece into a tubular shape, and cuts the crimping piece from a carrier piece, thereby connecting the wire ends by crimping. This prior art method requires the difficult step of positioning and abutting the ends of the wires against each other. Additionally burrs are likely to be formed if the wire ends overlap, and the burrs are likely to catch the nozzle.

A fourth prior art wire connection method winds an aluminum tape over and around the both wire ends to connect the wires. However the aluminum tape is expensive, and typically must be wound by hand, thereby causing poor operability and low connection reliability.

A fifth prior art wire connection method strips sheaths of the wire ends to expose strands and twists or braids the exposed strands to connect the wire ends. The twisting or braiding of the strands at both wire ends can be difficult to achieve. This operation is difficult to automate, and hence generally is done by hand. Manual operations of this type cause a poor operability and low connection reliability.

The manufacturing of a wiring harness requires a specified length of wire to be drawn from a wire supply and further requires terminals to be mounted on both ends of the cut wire by crimping, insulation displacement, etc. A prior art wire cutting/crimping apparatus is used for this purpose. A wire joint detecting apparatus is provided in a wire running path that extends from the wire supply to the wire cutting/crimping apparatus. The wire joint detecting apparatus detects the presence of a wire joint and cuts off the section of wire with a wire joint so that a product includes no wire joint.

The wire joint generally is formed by twisting exposed conductors. As a result, the wire joint typically is detected by applying a voltage to a pair of opposite untwisting rollers 1 (1*a*, 1*b* in FIG. 15) that are provided along a running path of a wire "a". More particularly, the rollers 1*a*, 1*b* are connected electrically via the wire joint when the exposed conductors of the wire joint pass between the rollers 1*a*, 1*b*. Thus the electrical connection of the rollers 1*a*, 1*b* detects the wire joint. A detection error can occur if there is a defective contact between the wire "a" and the rollers 1*a* and 1*b*. Additionally the wire joint cannot be detected unless the conductors are exposed.

Other prior art apparatus has detected the wire joint by a color sensor that detects the tape used in the prior art for joining wires. The detection by the color sensor does not require the conductors to be exposed. However, the sensor itself is expensive, it is difficult to adjust the sensor for detection and an erroneous detection frequently is made.

In view of the above, an object of the present invention is to provide a wire connecting method and apparatus, which have high connection reliability and which can be automated easily.

It is also an object of the invention to provide a wire joint detection method and apparatus for reliably allowing a detection of a wire joint regardless of whether the conductors are exposed at the wire joint.

SUMMARY OF THE INVENTION

The subject invention relates to a wire connecting method for connecting wires. The method commences by placing the ends of the wires to be connected on a base plate. The wires may be aligned along substantially the same axis with the ends of the wires facing each other. The method proceeds by placing a tape near the wire ends with the adhesive surface of the tape facing towards the wires. The method continues by placing a movable plate on the wire ends, and then moving the movable plate to roll the wire ends onto the tape between the movable plate and the base plate. This movement causes the tape to be wound at least partly over and around the wire ends to connect the wires.

The tape displays a strong resistance to tearing forces that act in the longitudinal direction of the tape. Thus, the wires are connected strongly. The tape may contain reinforced fibers to provide even a stronger tear resistance.

A specific embodiment of the method for connecting wires comprises placing the ends of the wires on a base plate such that portions of the wires on the base plate lie along the same axis and such that the wire ends face each other. The method then includes placing the tape parallel to the portions of the wires on the base plate with the adhesive surface of the tape faced up, and then placing a movable plate for rolling the wires on the wire ends. The method then comprises moving the wire ends toward the tape to roll the wire ends onto the tape between the movable plate and the base plate for winding the tape over and around the wire ends to connect the wires.

The above-described method can be employed while guiding a wire from a wire supply to a wire processing apparatus. In particular, the method is employed to replace a first wire drawn from a first wire supply with a second wire drawn from a second wire supply. The replacement is achieved by connecting the trailing end of the first wire with the leading end of the second wire. In this embodiment, the first wire is cut on the base plate to create the trailing end. The leading end of the second wire then is positioned on the same axis as the trailing end of the first wire, and both wire ends are rolled to wind the tape over and around the wires. The connected wire ends then may be rolled in the opposite direction to return the connected wires to the path along which the wire is drawn and guided. Thus, twists created in the wire during the winding of the tape can be untwisted, thereby enabling the wire to run smoothly thereafter.

The connected wire ends may be clamped and pulled in directions away from each other to check the adequacy of the connection. The adequacy of the connection may be judged based on any movement of the wires in response to the pulling forces. The wire processing apparatus can be controlled in accordance with a connection judgment signal to prevent possible problems caused by a breakage of the wire and the like resulting from a defective connection.

A wire joint makes a step or cross sectional dimensional change on the outer surface of a wire regardless of which connecting method is employed. For example, a joint formed by twisting conductors of wires exposed by stripping sheaths at ends of the wires provides a step because the twisted portion of the conductors has a larger diameter than the sheath-coated portion of the wire. Wires connected by mounting a sleeve or by welding have a step formed by the sleeve or a filling, respectively.

The invention may comprise a rotating or pivoting detector that is positioned adjacent to a running wire to detect a step in the wire. The detector will be caught by the step at the joint and will be rotated or pivoted as the joint runs past the detector. This rotating or pivoting movement actuates a switch to detect the joint. The switch may be a micro switch that detects the joint of the wire by projection and retraction of an actuator resulting from the rotation of the detector. The switch also may be a photoelectric switch that detects the joint by a change in an amount of light detected due to the rotation of the detector.

A wire connecting apparatus in accordance with the invention comprises a frame with base plates. The apparatus also has a movable plate which is movable toward and away from the base plates and which is capable of reciprocating along a direction parallel to the extension of wires and a tape. A cutting device is provided for cutting the first wire, and a transfer plate is provided for transferring an end of the second wire toward the first wire while supporting the second wire. Jigs are provided for feeding and positioning the tape. More particularly, the jigs may be operative for drawing the tape from a roll of tape, aligning the tape parallel to the ends of the wires and cutting the tape to a specified length. The apparatus further includes driving means for respectively driving the movable plate, the cutting device, the transferring plate and the parallel cutting jigs.

The apparatus may further comprise jigs for clamping the wires on a wire drawing/guiding path. The jigs are provided on the apparatus frame on opposed sides of the wire or above and below the base plate. One jig may be movable away from the other jig, or upward along the wire drawing/guiding path. A connection judgment can be made by moving the one jig after the wires are clamped by both jigs. In other words, the connection is satisfactory if the movement of the one jig stops at such a position where the wires are just straightened, whereas the connection is not satisfactory if the one jig moves beyond such a position.

The movable plate may be split into two sections for the one wire and the other wire, respectively, and the split sections of the movable plate may be elastically movable toward and away from the wires. Then, even if diameters of the wires to be connected differ, the two split sections of the movable plate take up a diameter difference by elastically adjusting their distances to the wire ends, thereby enabling a smooth connection.

According to the invention, there is further provided a wire joint detecting apparatus, in particular for use with a wire connecting apparatus. The wire joint detecting apparatus comprises a rotating or pivoting detector for sliding contact with a running wire. The detector is operative to be rotated or pivoted by a cross sectional dimensional change indicative of a joint of the wire. The wire joint detecting apparatus further comprises a detection switch for detecting the rotation or pivotal movement of the detector to detect the joint.

The wire joint detecting apparatus may further comprise an operable plate. The operable plate and the detector switch may be mounted on a frame, such that pivotal movement of the operable plate may actuate the detection switch. The detector that contacts the running wire may be mounted on the operable plate for pivotal or rotational movement. More particularly, the detector is rotated or pivoted by a step formed on the wire by the joint. The operable plate then is pivoted by the rotation of the detector to actuate the detection switch. Thus the joint of the wire is detected by a signal of the detection switch.

Preferably, the detection switch is a photoelectric switch, and the joint of the wire is detected by a change in an amount of light detected by the photoelectric switch resulting from the rotation of the detector.

The portion of the detector that is in sliding contact with the wire may be a substantially V-shaped groove in which the wire is at least partly fit.

The detector for pivoting the operable plate preferably has a shape such that a distance between a point of sliding contact with the wire and a center of rotation changes. For example, the shape may be a polygon such as a rectangle or triangle. The center of the polygon serves as an axis of rotation. If surfaces of a V-shaped groove are employed as contact surfaces of the detector with the wire to increase points of contact (see e.g. FIG. 14), a joint can be detected even if the joint forms a small step, thereby improving detection accuracy. Further, the switch is actuated, for example, by having its actuator or the like pushed by the pivotal movement of the operable plate.

These and other objects, features and advantages of the present invention will become more apparent upon a reading of the following detailed description and accompanying drawings.

BRIEF DESCRIPTION OF THE DRAWINGS

FIGS. 8(*b*) to 8(*g*) are schematic plan views showing the action of the embodiment.

DETAILED DESCRIPTION OF THE PREFERRED EMBODIMENTS

Figure 1:
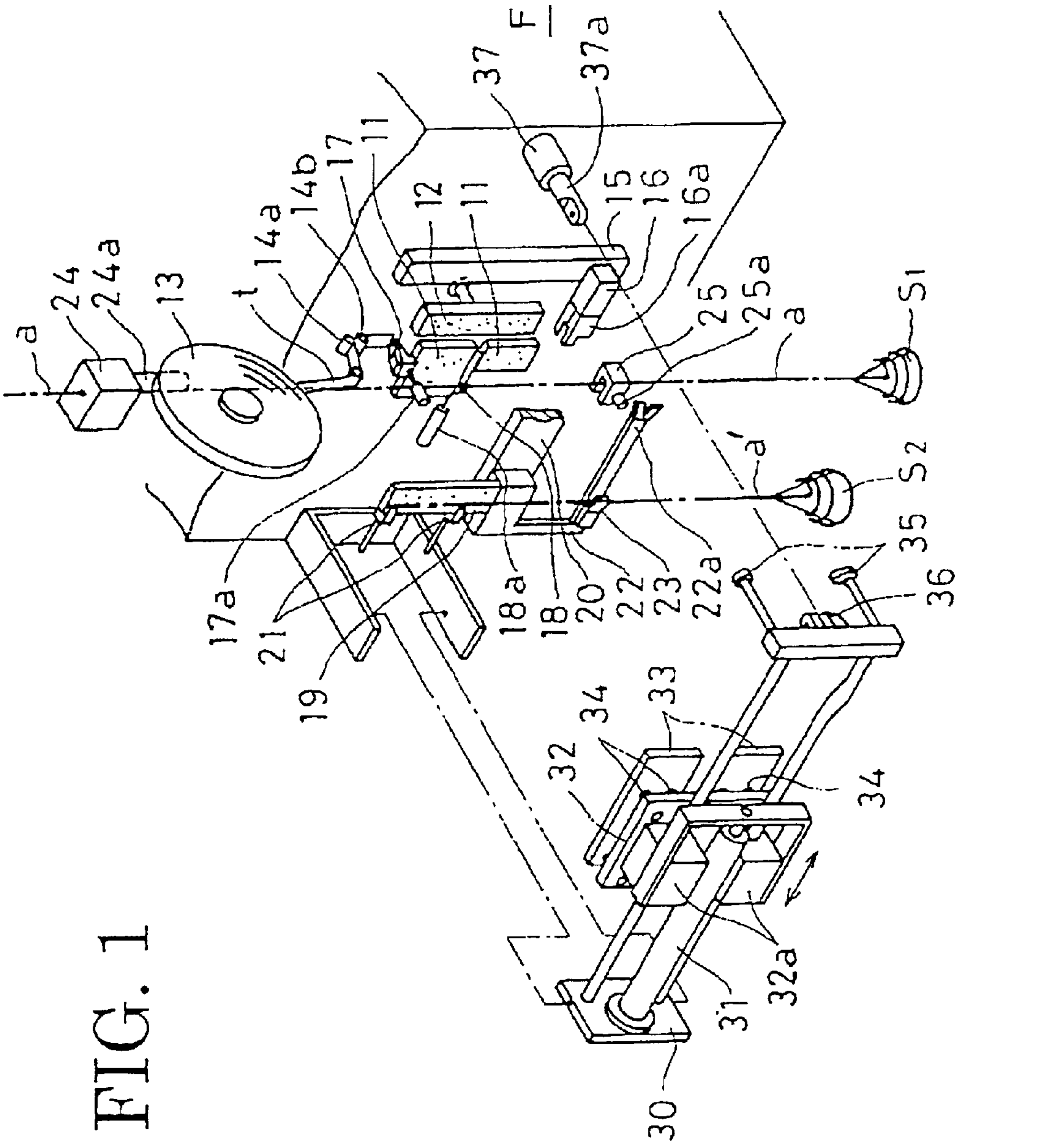
FIG. 1 is a schematic perspective view of one embodiment of the invention.

An apparatus in accordance with one embodiment of the invention is illustrated in FIGS. 1–8. As shown most clearly in FIG. 1, the apparatus includes a frame F with a base plate 11 that is used for rolling wire ends so that the wires or wire ends pivot or rotate around their axes or around a direction of their longitudinal extension. A movable plate 33 is provided for rolling the wire ends. The apparatus further includes a cutting device 18 for cutting a first wire "a", a transferring plate 19 onto which a wire to be connected can be transferred, and a tape drawing device 16 for drawing a tape "t". A forcible wire withdrawing or dropping mechanism may be provided for forcibly withdrawing the portion of the first wire "a" which is no longer needed, i.e. the portion of the first wire "a" different from that portion of the first wire "a" to be connected to the second wire "a" by means of the tape "t". The forcible wire withdrawing mechanism may include a withdrawing roller that can be brought into contact with the portion of the first wire "a" to be withdrawn.

The base plate 11 is secured to the frame F, and an auxiliary base plate 12 is provided at one side of the base plate 11 for movement toward and away from the frame F by an unillustrated air cylinder or other moving or actuating means, such as a step motor. The auxiliary base plate 12 is retracted toward the frame F when the tape drawing device 16 draws the tape t, and is moved forward to be substantially flush with the base plate 11 when the tape t is wound around the wire "a".

Figure 6:
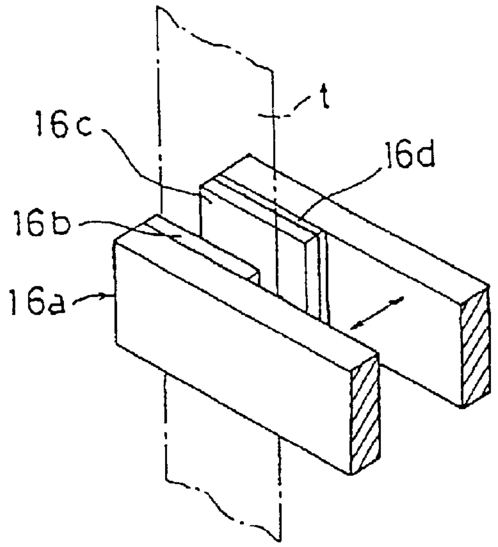
FIG. 6 is a perspective view showing how a tape is clamped according to the embodiment.
Figure 7A:
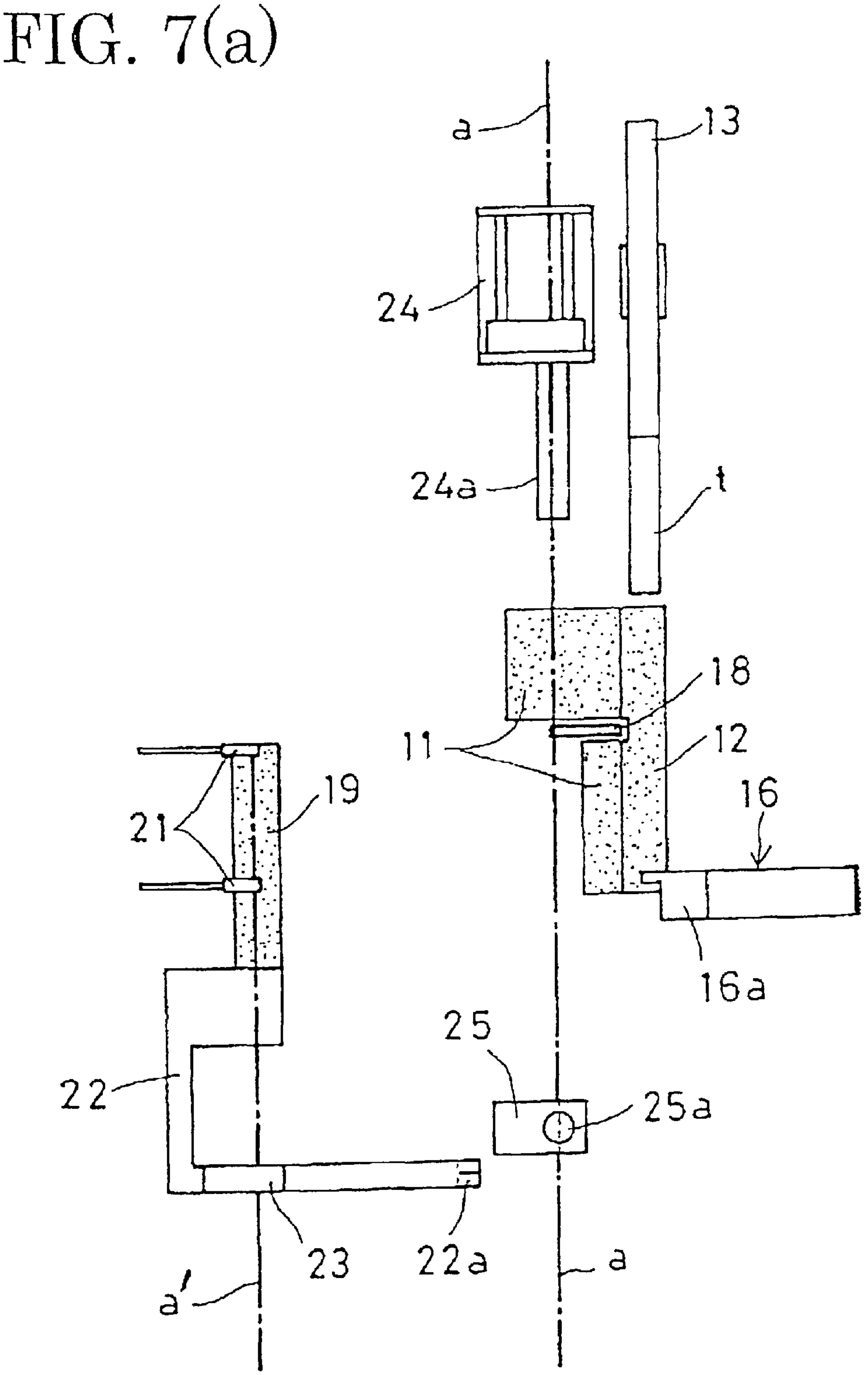
FIGS. 7(*a*) to 7(*g*) are schematic front views showing the action of the embodiment.
Figure 7B:
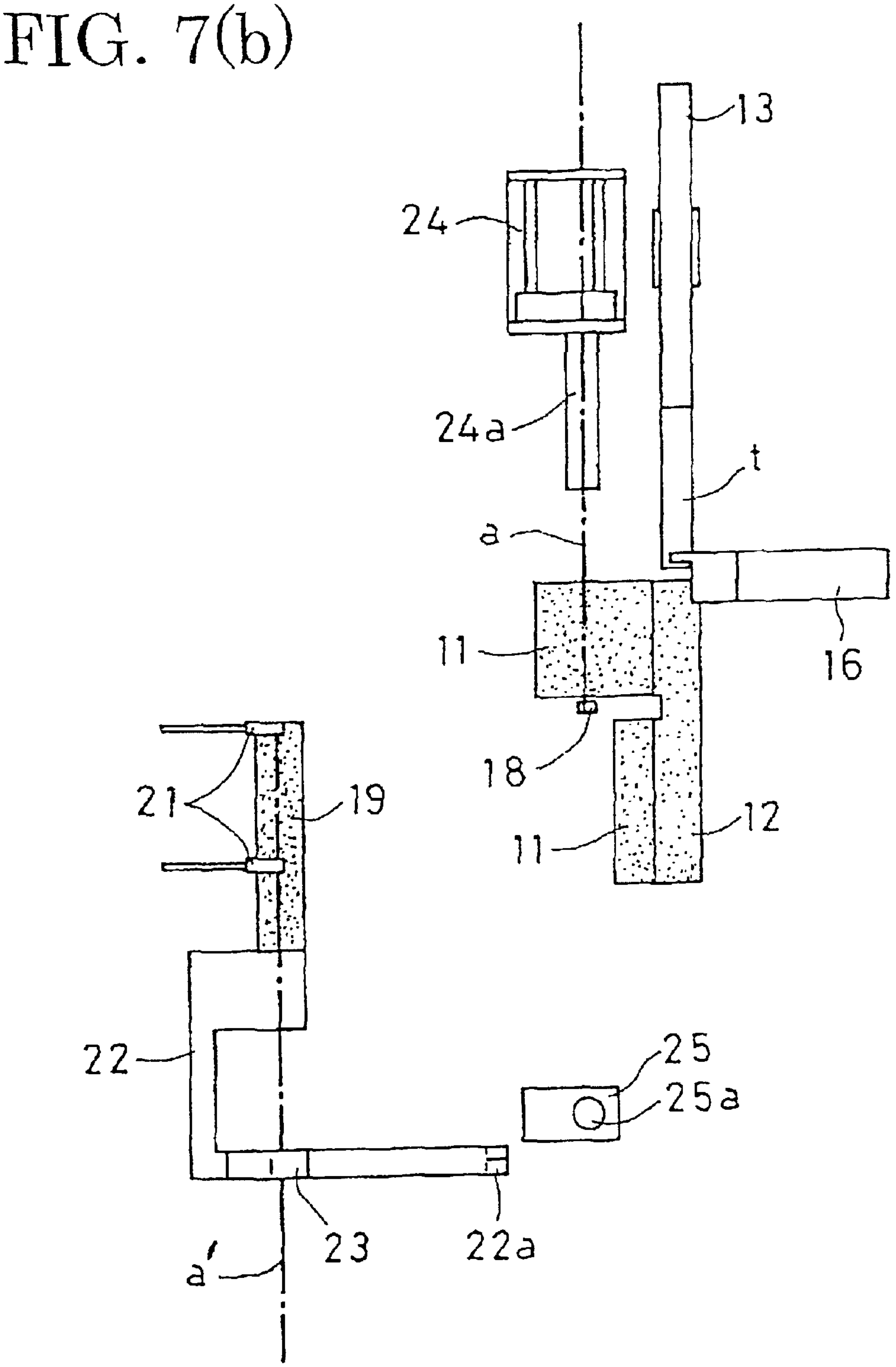
Figure 7C:
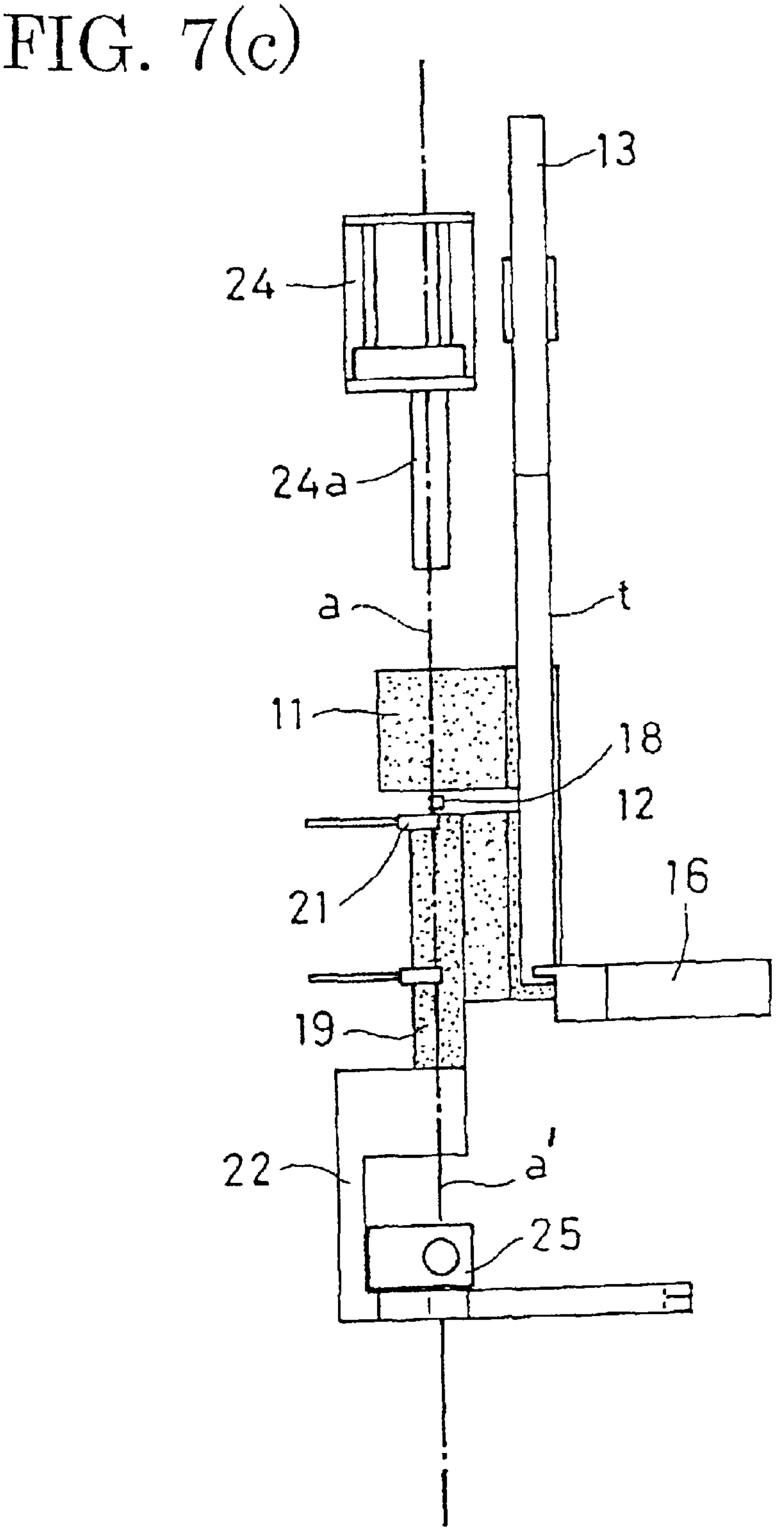
Figure 7D:
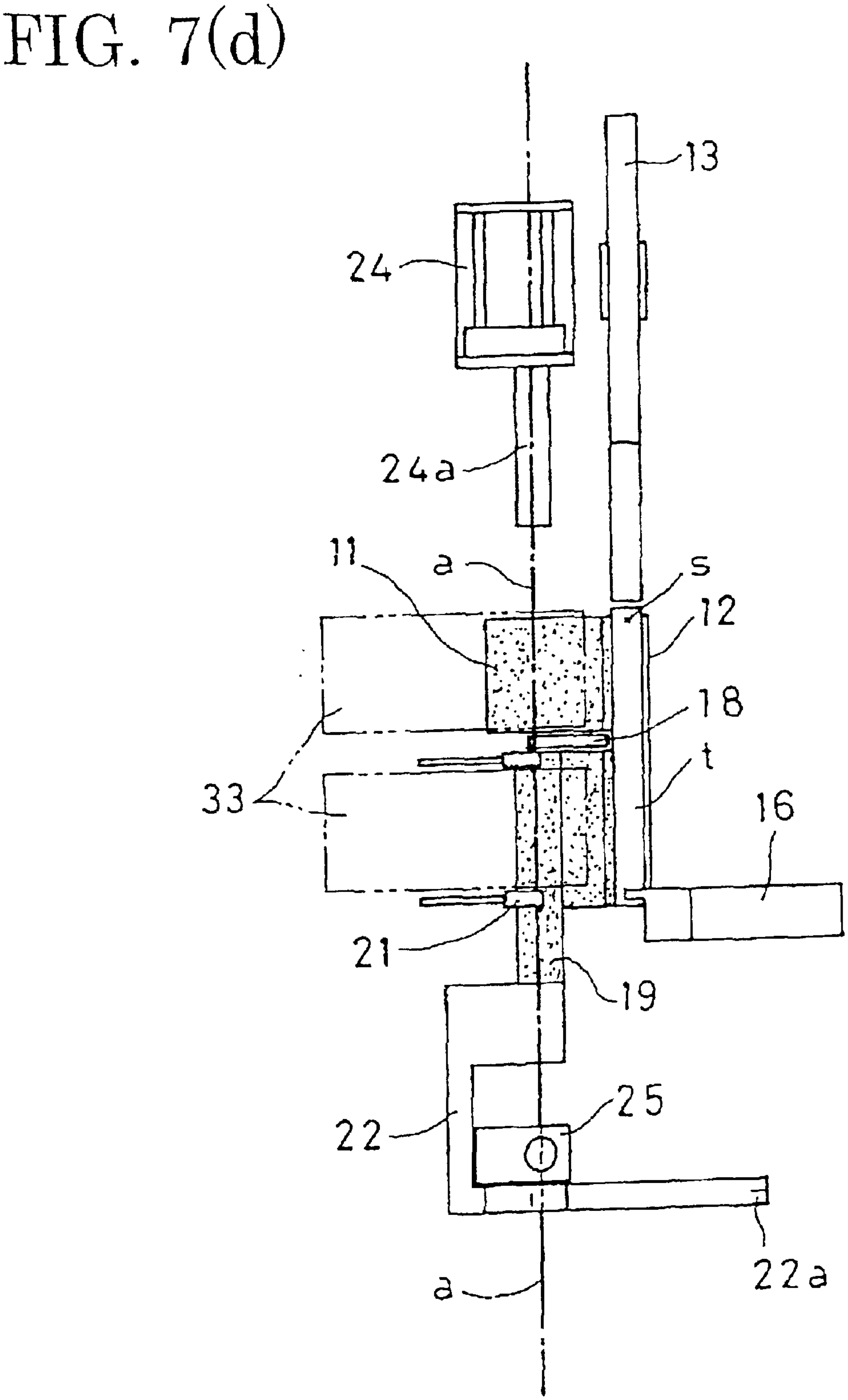
Figure 7E:
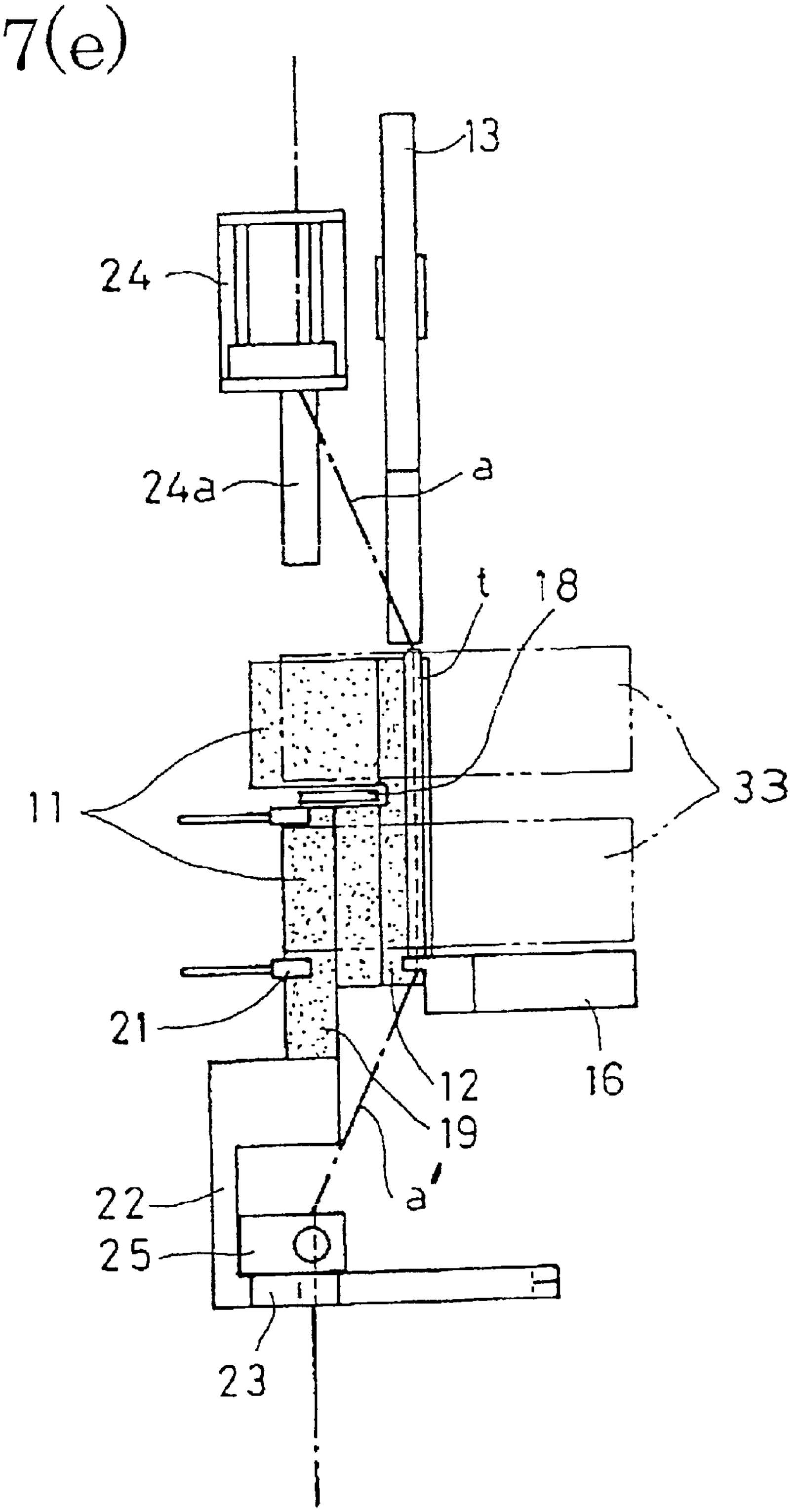
Figure 7F:
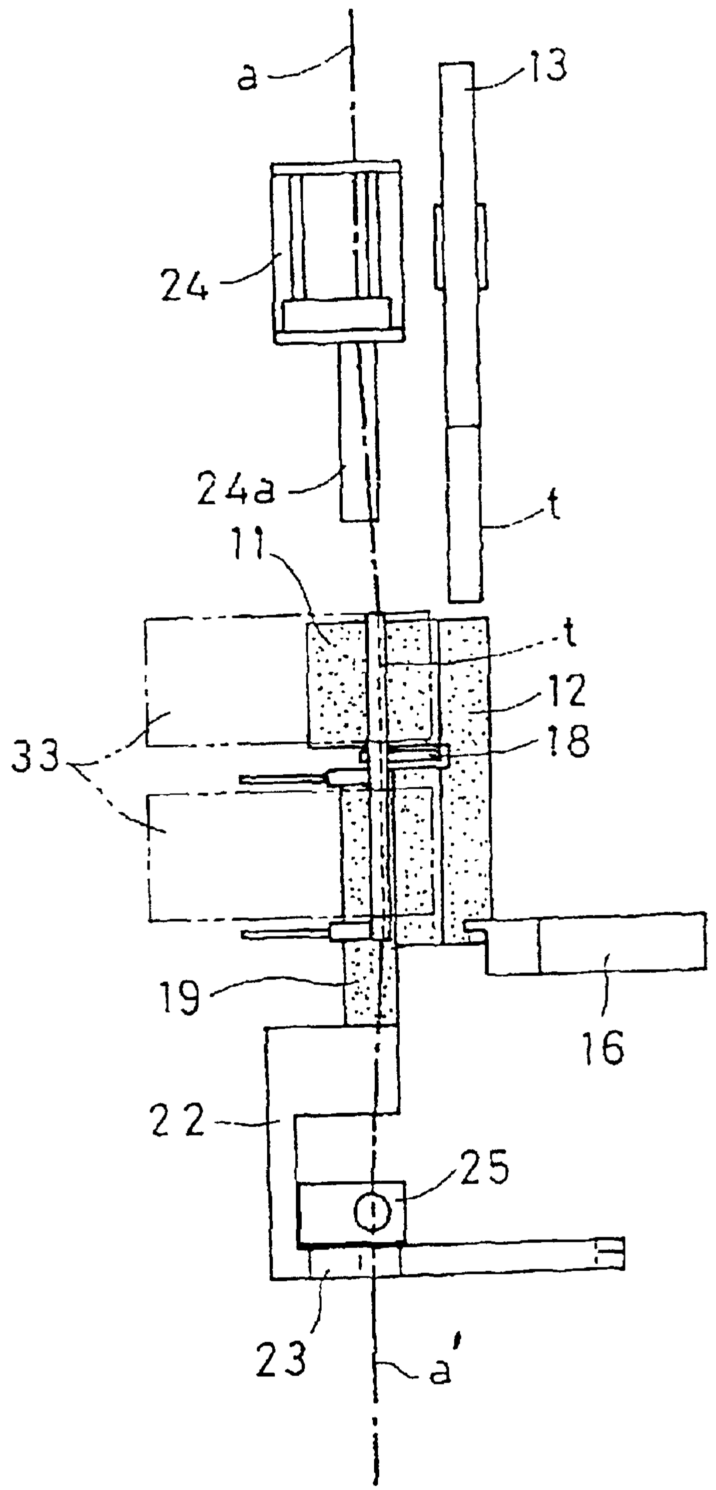
Figure 7G:
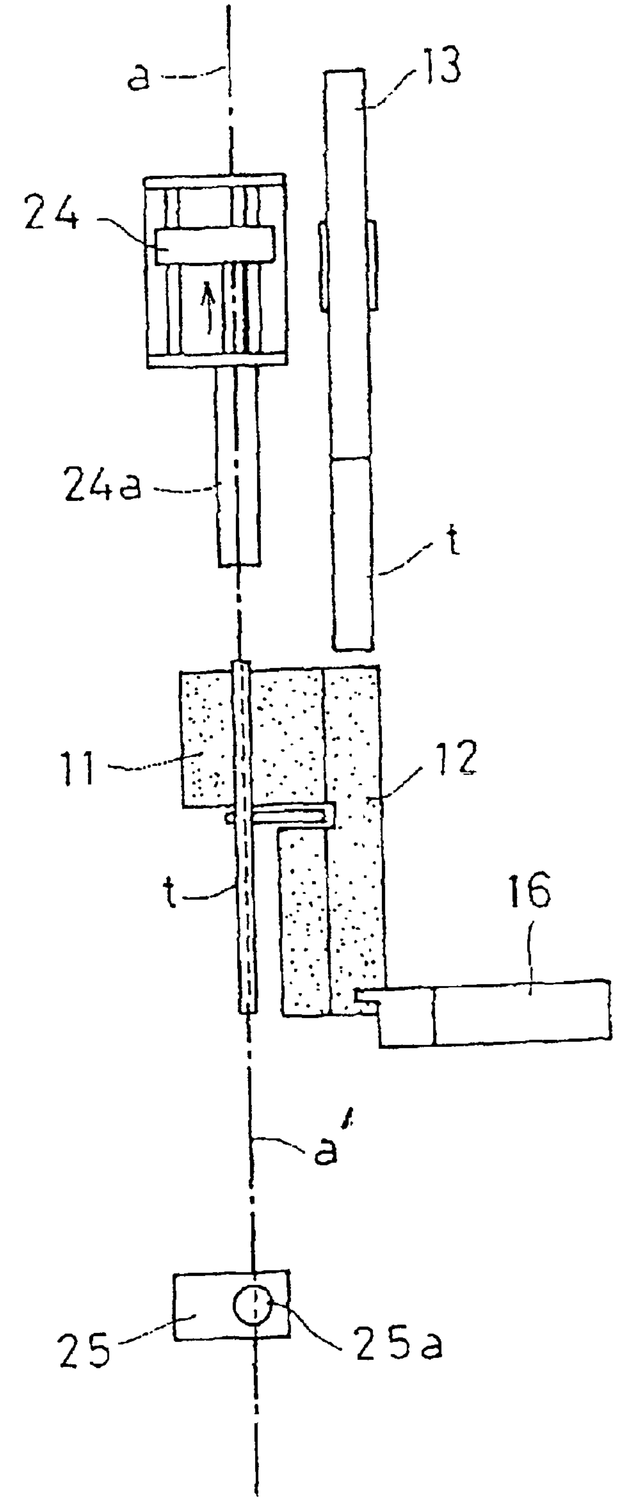
Figure 8A:
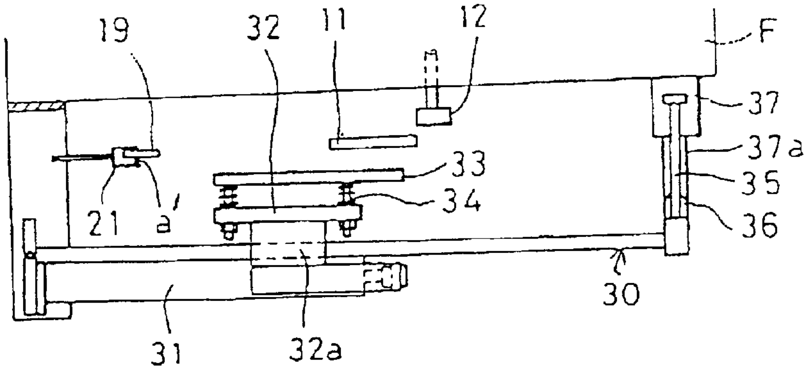
FIG. 8(*a*) is a schematic plan view showing the action of the embodiment.
Figure 8B:
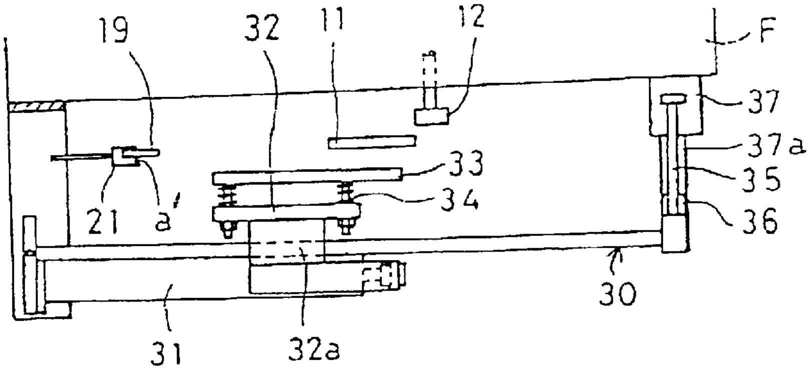
Figure 8C:
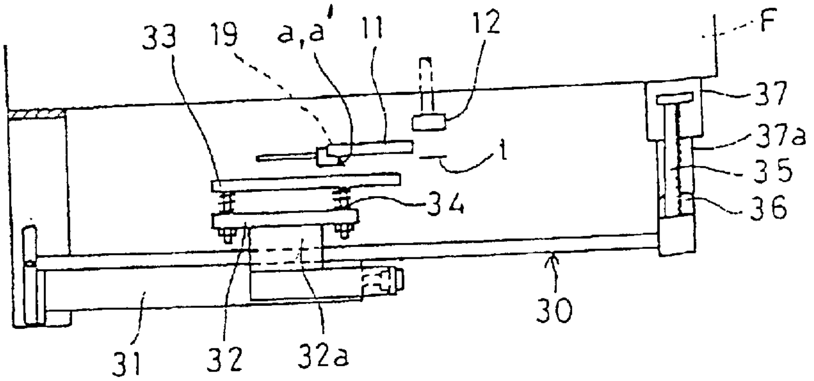
Figure 8D:
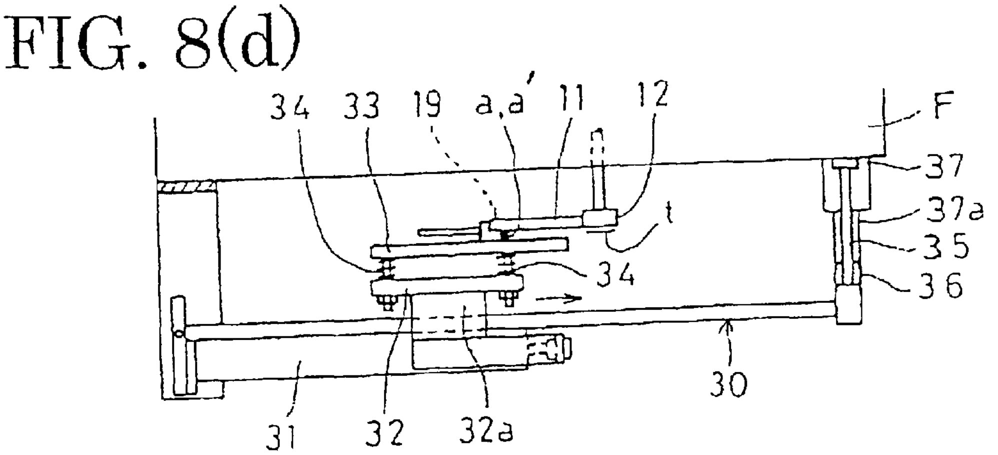
Figure 8E:
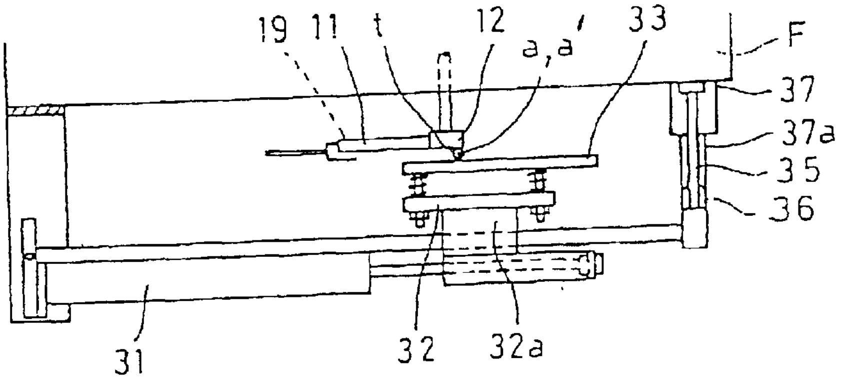
Figure 8F:
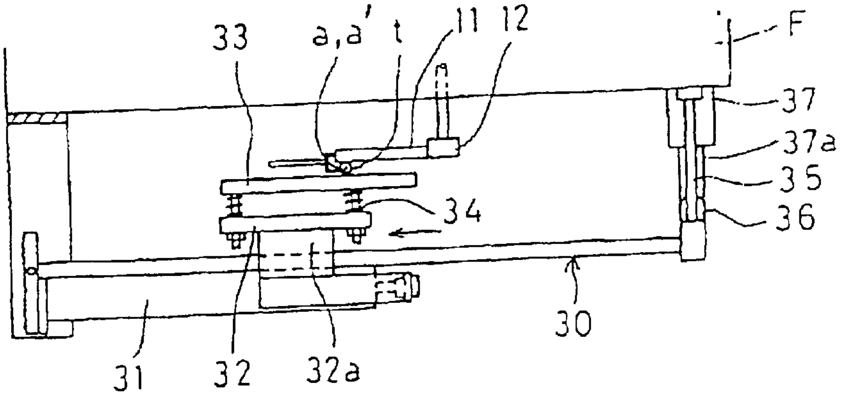
Figure 8G:
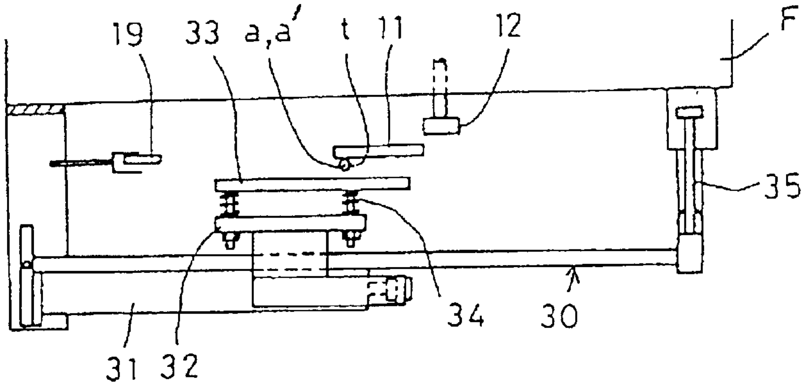

A roll of tape 13 is provided above the base plate 11, and the tape t can be guided from the tape roll 13 to a position above the auxiliary base plate 12 via guide rollers 14*a*, 14*b*. The tape t has an adhesive layer formed on its inner surface in its rolled state, and hangs down slightly while having its adhesive layer adhered to the lower guide roller 14*b*. The tape t is positioned on the auxiliary base plate 12 by clamping and lowering the hanging piece of the tape t with a clamping jig 16*a* of the vertically movable drawing device 16. As shown in FIG. 6, the clamping jig 16*a* has clamping pieces 16*b*, 16*c* that substantially face each other. The clamping piece 16*c* is supported via an insulating plate 16*d*, such as a Bakelite plate. Thus voltage can be applied to the clamping pieces 16*b*, 16*c* while providing an electrical insulation therebetween. At least one of the clamping pieces 16*b*, 16*c* is moved toward the other to clamp the tape t. If, for some reason, the tape t is not present, the clamping pieces 16*b*, 16*c* are brought into contact with each other to create an electrical connection, thereby enabling detection of the erroneous clamping. Succeeding operations will not be performed if an erroneous clamping signal is produced. An operator then resets the tape t, and a tape pulling-down operation follows. The drawing device 16 is moved vertically by an unillustrated driving means provided in the guide 15.

A cutting device 17 cuts the tape t after the specified length has been pulled down. The cut end of the tape t then is pressed and supported by a probe provided in the cutting device 17 (at point S in FIG. 7(*d*)). A movable plate 33 moves the cutting device 17 forward when the wire "a" is brought to an end position of the tape t, and the tape t is released at that time. Simultaneously, the drawing device 16 is retracted forward. Accordingly, the movement of the movable plate 33 is neither interfered with nor hindered. The cutting device 17 is moved forward and backward by an air cylinder 17*a*, and the drawing device 16 is caused to clamp the tape t and retract by opening and closing movements and by a retracting movement (forward movement) of the clamping jig 16*a* at its leading end. An unillustrated air cylinder preferably causes these movements.

The base plate 11 is split into first or upper and second or lower sections, between which the cutting device 18 is provided. The cutting device 18 is actuated by an air cylinder 18*a* to cut the substantially vertically guided wire "a" and to clamp the upper part of the cut wire "a". The cutting device 18 releases the wire "a" at a moment when or after the wire "a" is clamped between the movable plate 33 and the base plate 11, and is retracted into a clearance between the upper and lower sections of the base plate 11. The movable plate 33 also preferably is split into first or upper and second or lower sections. The cutting device 18 is located between the upper and lower sections of the movable plate 33, and hence the cutting device 18 neither interferes with nor hinders the movement of the movable plate 33.

The transferring plate 19 is transversely movable by a guide 20. A wire "a" to be connected is inserted laterally into clips 21 e.g. from the right side to be clamped and supported. The transferring plate 19 is moved transversely to the direction of extension of the wires a, a' by an unillustrated driving means provided in the guide 20. A U-shaped arm 22 is provided below the transferring plate 19, and the wire "a" is inserted into a clip 23 provided in an intermediate position of the arm 22 e.g. from the right side to be clamped. A leading end 22*a* of the arm 22 also drives away the lower part of the cut wire "a", so that this lower part of the wire "a" does not stand as a hindrance.

Guiding jigs 24, 25 are provided on the frame F at substantially opposed sides of the base plate 11 or above and below the base plate 11, respectively. The guiding jigs 24, 25 each are provided with a chuck. The upper guiding jig 24 is driven by an air cylinder 24*a* and moves upward while clamping the wire "a" by means of the chuck. The lower guiding jig 25 is actuated by an air cylinder 25*a* to clamp, fix or position the wire "a". Thus, the upper and lower guiding jigs 24, 25 clamp the wires "a", "a" while the upper guiding jig 24 moves upward, thereby straightening the wires "a", "a" to judge whether the tape t has been wound satisfactorily, as described later. If the connection of the wires "a", "a'" is satisfactory, the upward movement of the upper guiding jig 24 stops at a specified position. If the guiding jig 24 moves further upward, a defective connection is judged to exist, and the feeding of the wires "a", "a'" is stopped.

Figure 5:
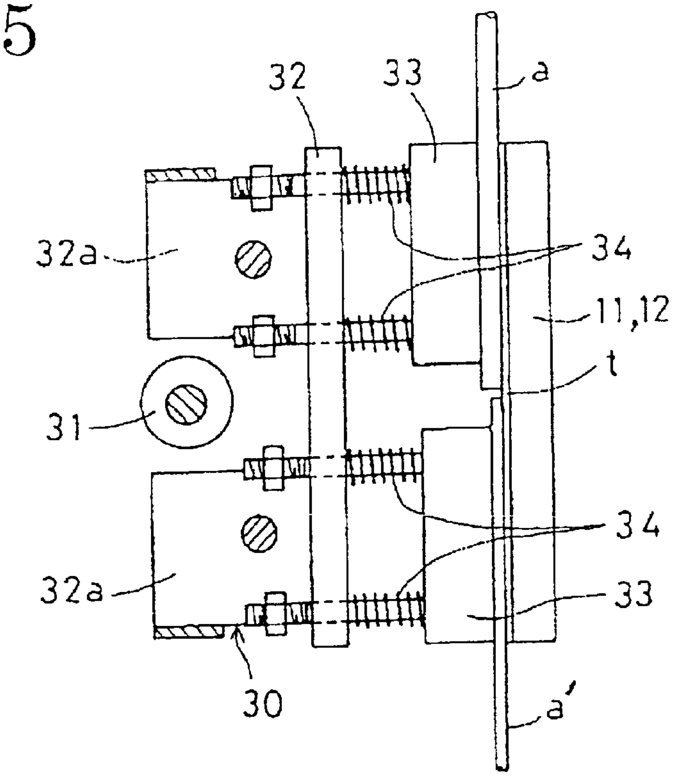
FIG. 5 is a side view showing an essential portion of the embodiment.

An auxiliary frame 30 is provided on the front surface of the base plate 11 of the frame F and is pivotal along forward and backward directions about its left end. A movable plate 32 is provided on the frame 30 via a slider 32*a* for transverse movement by an air cylinder 31. The split movable plate 33 is provided at an inner side of the movable plate 32. More particularly, the movable plate 33 is supported on the movable plate 32 for movement toward and away from the movable plate 32, and preferably is biased away from the movable plate 32 by springs 34. Therefore, as shown in FIG. 5, the movable plate 33 smoothly holds the wires "a", "a'" in cooperation with the base plate 11 by the elastic force of the springs 34 even if the diameters of the wires "a", "a'" differ when the movable plate 33 is pressed into contact with the wires "a", "a'".

Stoppers 35 are provided at the leading end of the frame 30. The length of the stoppers 35 is adjustable, and a contact degree (degree of proximity or distance) of the movable plate 33 with respect to the base plates 11, 12 can be adjusted by adjusting the length of the stoppers 35. This adjustment is effective to prevent abrasion of the outer surfaces of the plates 33, 11, 12. Specifically, a non-slip layer to which e.g. sand-like particles are adhered is formed on the contact surface of each of the plates 11, 12, 19 and 33 so that the wires "a", "a'" can be rolled smoothly. Adjusting the contact degree can prevent abrasion of the non-slip layers.

An air cylinder 37 is fixed to the frame F and has a piston rod 37*a* coupled by a pin to a hook 36 at the leading end of the frame 30. The frame 30 is pulled toward the base plate 11 by the actuation of the air cylinder 37, thereby bringing the movable plate 33 substantially into contact (or closer to) the base plate 11 and the wires "a", "a'". In this state, the movable plate 33 is moved to the right by actuating the air cylinder 31 to wind the tape t over and around the wires "a", "a'" by rolling the wires "a", "a'".

The apparatus illustrated in FIG. 1 can be used to replace the first wire "a" from the first wire supply S1 by the second wire "a'"from the second wire supply $S_2$ where the first wire "a" is being guided to a wire processing apparatus (not shown) through the upper and lower guiding jigs 24, 25. More particularly, the clips 21, 23 of the plate 19 and the arm 22 clamp the wire "a" beforehand. If a wire exchange signal (e.g. by turning a lamp on) is inputted from the wire processing apparatus in this state, the drawing of the wire "a" is stopped e.g. upon pressing an unillustrated start switch, thereby proceeding to the operation of connecting the wires "a", "a'". The clips 21, 23 are provided with clamp completion switches. At this stage, unless these switches are on, the connecting operation preferably is not started even if the start switch is turned on. This is because a connection error is likely to occur if the wires "a", "a'" are clamped insufficiently by the clips 21, 23.

Figure 2:
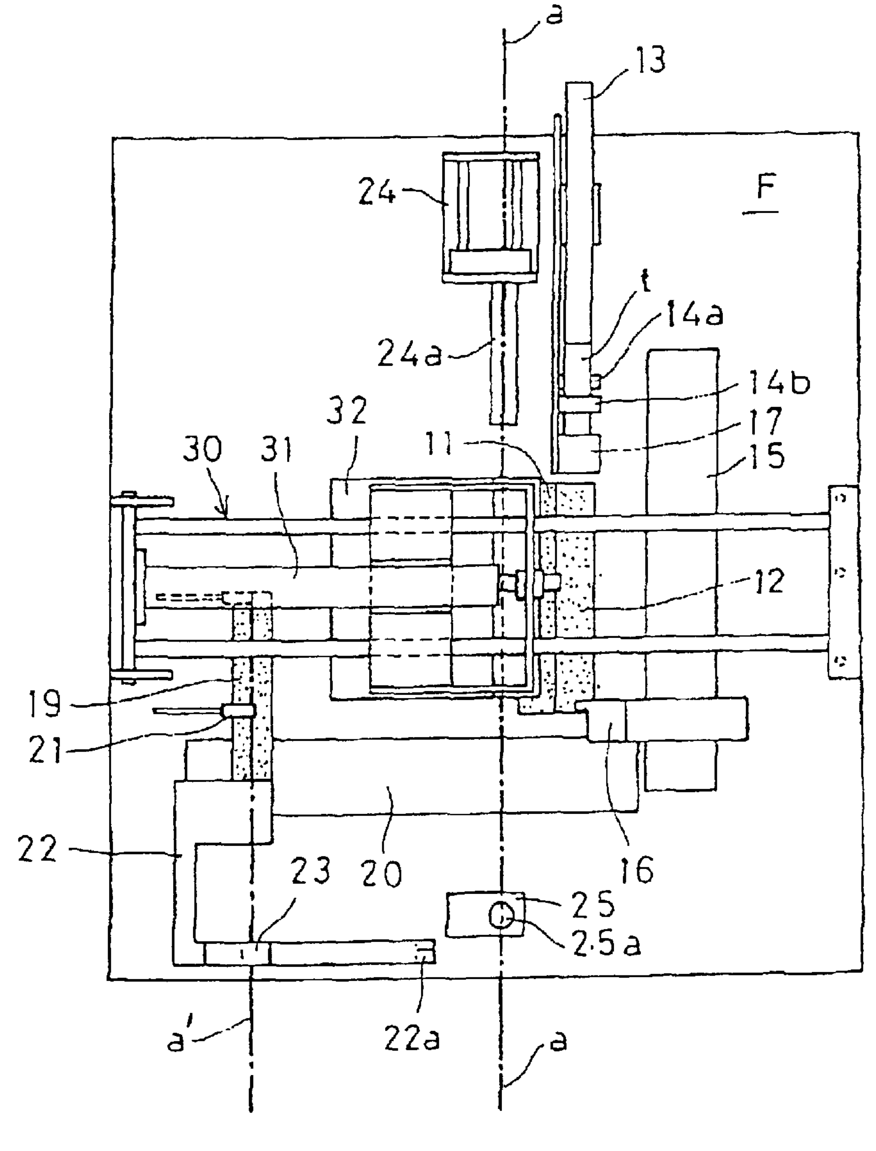
FIGS. 2 to 4 are front views showing an action of the embodiment.
Figure 3:
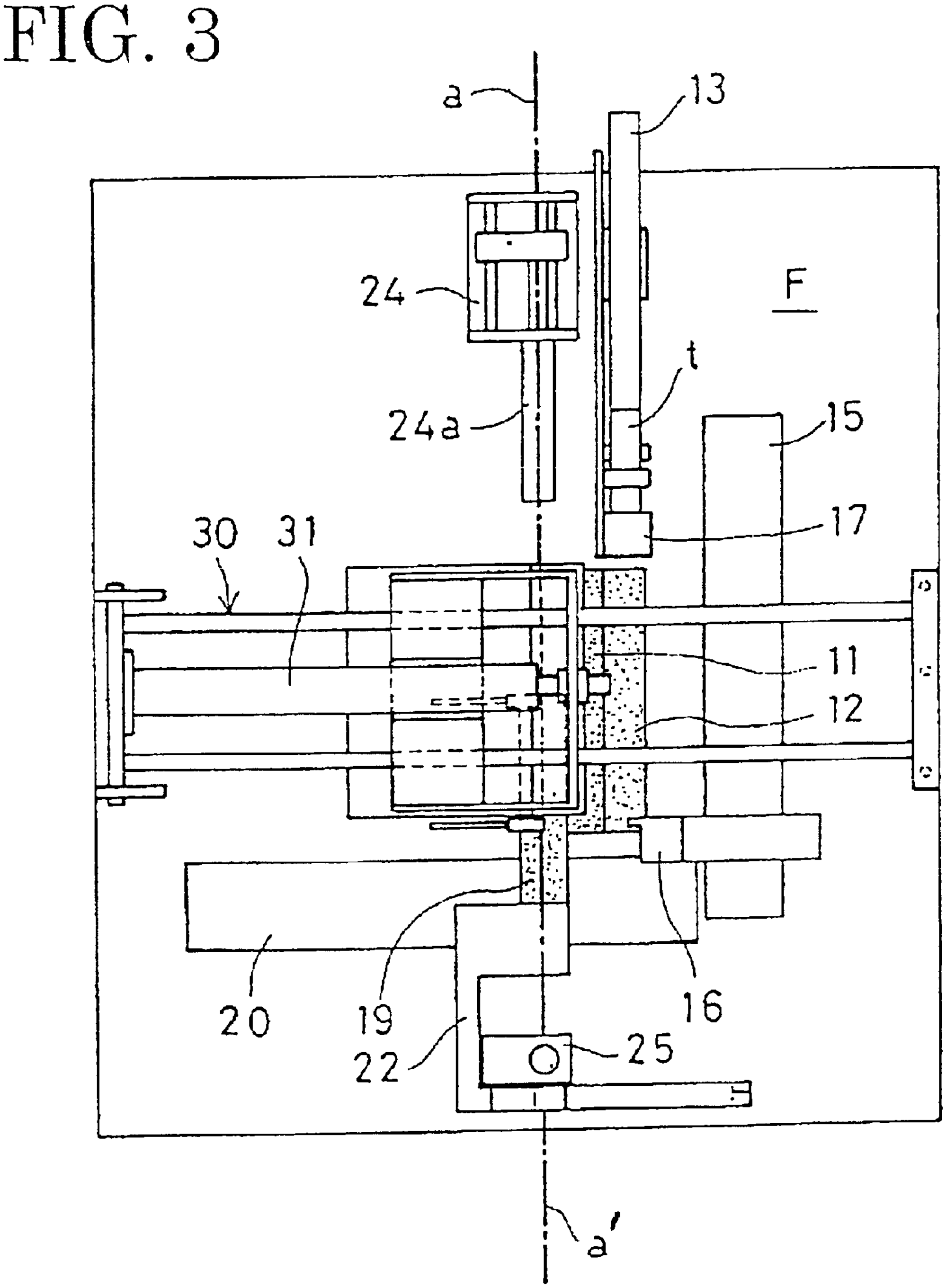
Figure 4:
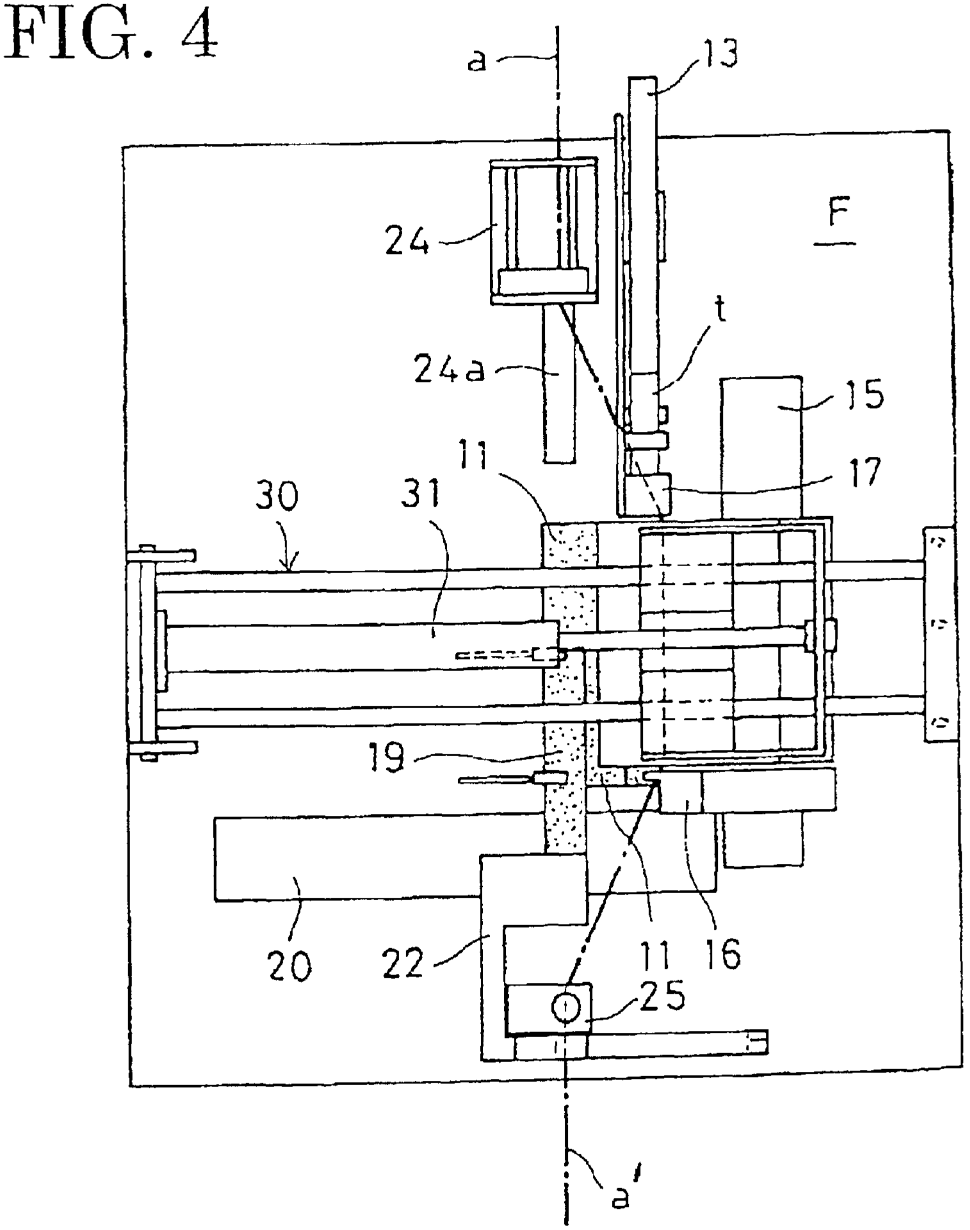
Figure 9:
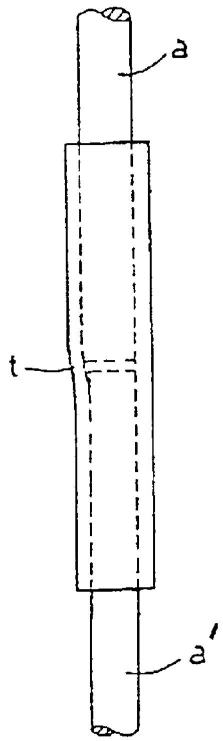
FIG. 9 is a diagram showing a connected state of wires.

The connection operation is performed by first moving the tape drawing device 16 upward from the state shown in FIGS. 2, 7(*a*) and 8(*a*) to clamp the tape t drawn by means of the clamping jig 16*a* (see FIGS. 7(*b*) and 8(*b*)). The tape t then is drawn to extend at least partly substantially along the auxiliary base plate 12 (see FIGS. 7(*c*) and 8(*c*)). Simultaneously with the completion of this operation, the tape t is cut and the transferring plate 19 is moved to the right to abut against the lower base plate 11 (see FIGS. 7(*c*) and 8(*c*)). In this state, the frame 30 is moved closer to the frame F so that the movable plate 33 contacts or comes closer to the base plate 11 with the wires "a", "a'" located therebetween (see FIGS. 7(*d*) and 8(*d*)). The movable plate 33 then is moved to the right (see FIGS. 7(*e*) and 8(*e*)). As the movable plate 33 is moved, the wires "a", "a'" are rolled between the base plate 11 and the movable plate 33 and, consequently, the wires "a" "a'" are rolled on the tape t on the auxiliary base plate 12. This rolling movement causes the tape t to be wound over and around the wires "a", "a'" to connect or join the wires "a", "a'", as shown in FIG. 9 (see FIGS. 7(*e*) and 8(*e*)).

The movable plate 33 then is moved to the left to untwist the wires "a", "a'" (see FIGS. 7(*f*) and 8(*f*)), and the frame 30 is moved away from the frame F to return the movable plate 33 to its initial position. As the movable plate 33 is returned, the upper and lower guiding jigs 24, 25 clamp the wires "a", "a'" and the upper guiding jig 24 is moved upward to judge whether the connection is satisfactory (see FIGS. 7(*g*) and 8(*g*)). The above operations are performed automatically to connect the wires "a", "a'" when the wires "a", "a'" are exchanged.

The inventive method and apparatus thus constructed achieve high connection reliability and easily enable automation of the wire connection.

Figure 10:
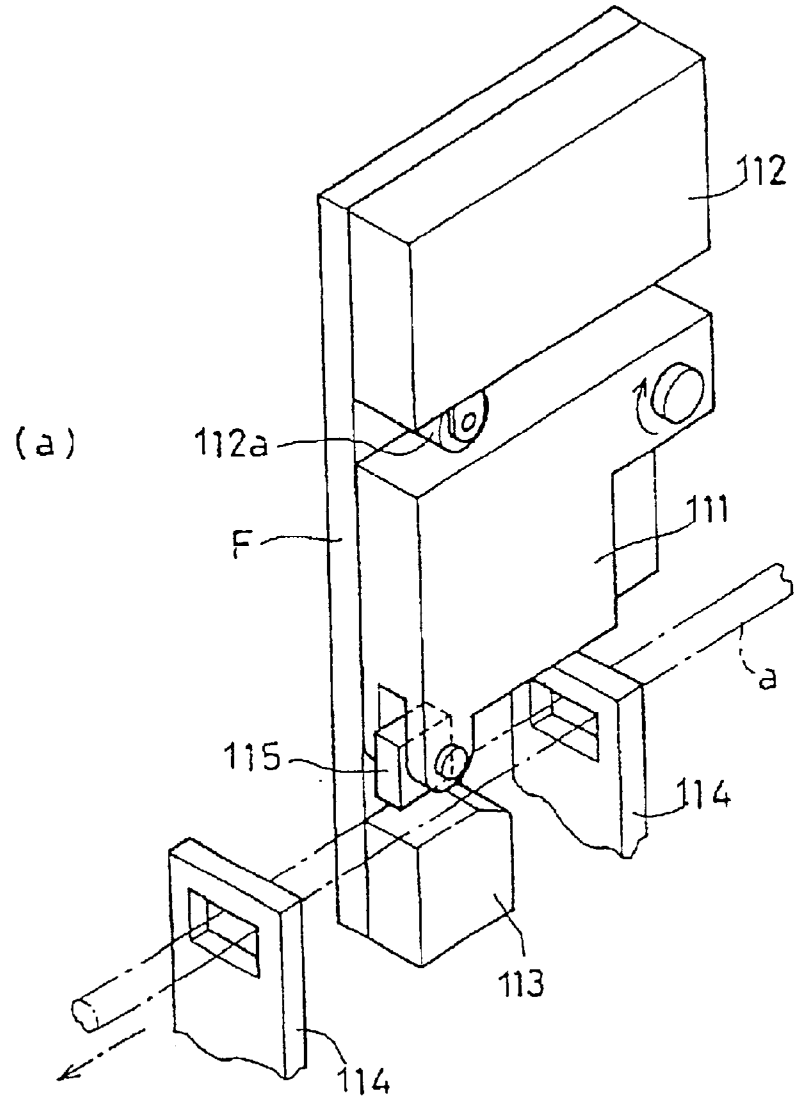
FIGS. 10(*a*) and 10(*b*) are a perspective view of one embodiment of the invention and a front view of a detecting section of the embodiment.
Figure 10:
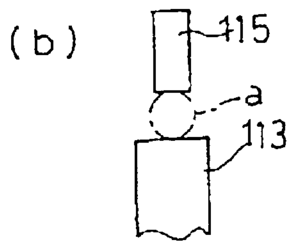
Figure 11:
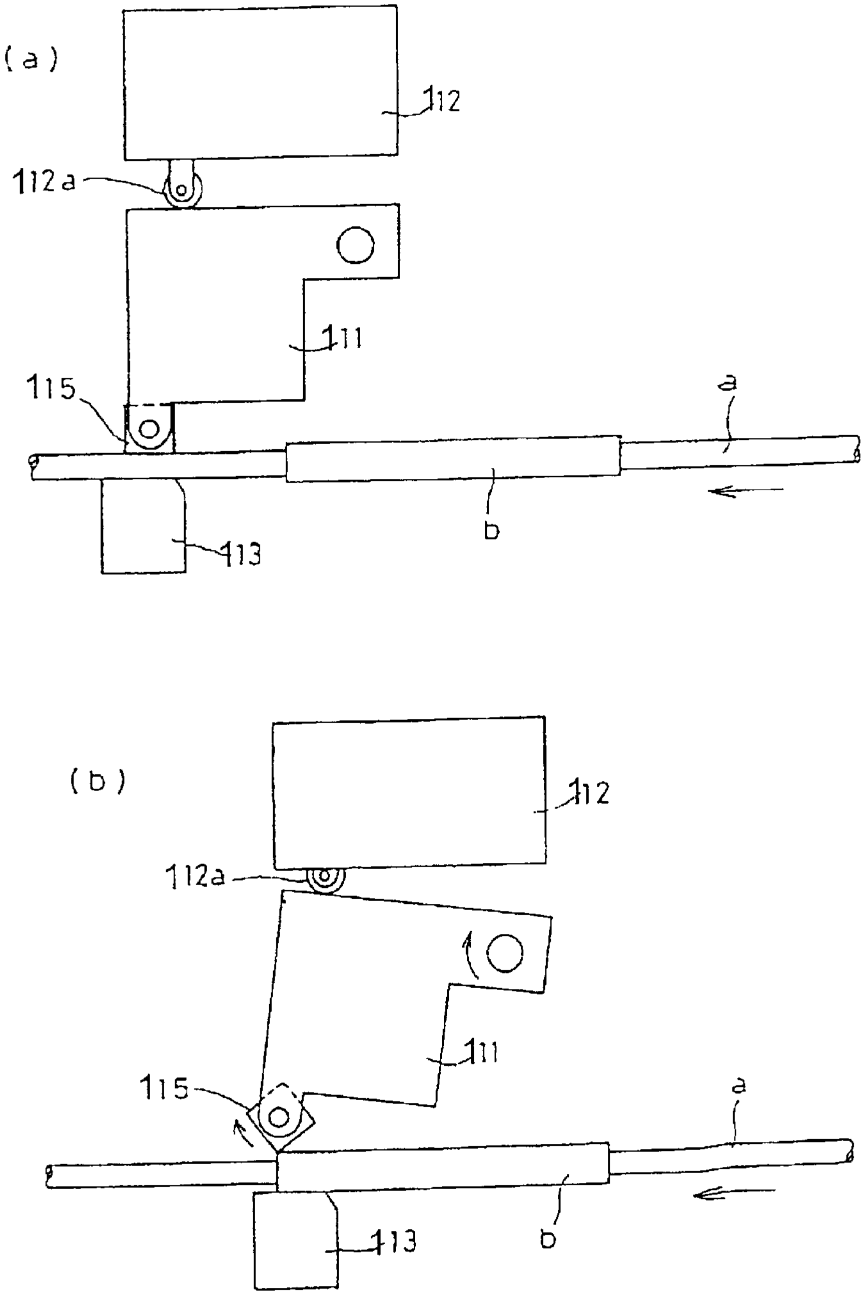
FIGS. 11(*a*) and 11(*b*) are diagrams showing how the embodiment works.

A second aspect of the invention is described with reference to FIGS. 10 and 11. More particularly, FIGS. 10 and 11 show a location along a wire running path to a wire processing apparatus, such as a wire cutting/crimping apparatus. An operable plate 111 is provided on a frame F for pivotal or rotational movement, and a micro switch 112 is provided above or in proximity to the operable plate 111 along the direction of movement. Thus, if the operable plate 111 is pivoted away from the wire "a" as indicated by an arrow in FIG. 11(*b*), an actuator 112*a* is pushed up to actuate the micro switch 112. Alternatively or additionally any other detector sensing a pivotal movement, such as a proximity sensor, a light/diode sensor or the like may be used.

A wire-contacting jig 113 and a guide 114 are provided on the frame F below or at an opposite side of the operable plate 111, and the wire "a" runs through or on the wire-contacting jig 113 and the guide 114. A substantially rectangular detector 115 is provided at an end of the operable plate 111 substantially facing the wire-contacting jig 113, and is rotatable about its center axis. One side of the detector 115 is constantly held in sliding contact with the wire "a" running on the wire-contacting jig 113.

Thus, while the wire "a" is running, the operable plate 111 is not pivoted or rotated away from the wire "a", and the micro switch 112 is not turned on as shown in FIG. 11(*a*).

When a joint formed e.g. by winding a tape t (as described above with reference to FIGS. 1 to 9) reaches the wire contacting jig 113, the detector 115 contacts the step or cross sectional dimensional change formed by the wound tape t, as shown in FIG. 11(*b*), and rotates upward. This rotation causes the operable plate 111 to pivot upward and actuate the micro switch 112. The joint t is detected based on a signal representing the operation of the micro switch 112, and the detection is notified to the wire processing apparatus.

The succeeding side of the rotated detector 115 comes into sliding contact with the wire "a" beyond the tape t, and the operable plate 111 is pivoted downward to return substantially to its normal state for detecting a next joint tape t. The joint tapes t of the wire "a" are detected successively by repeating the above operation.

Figure 12:
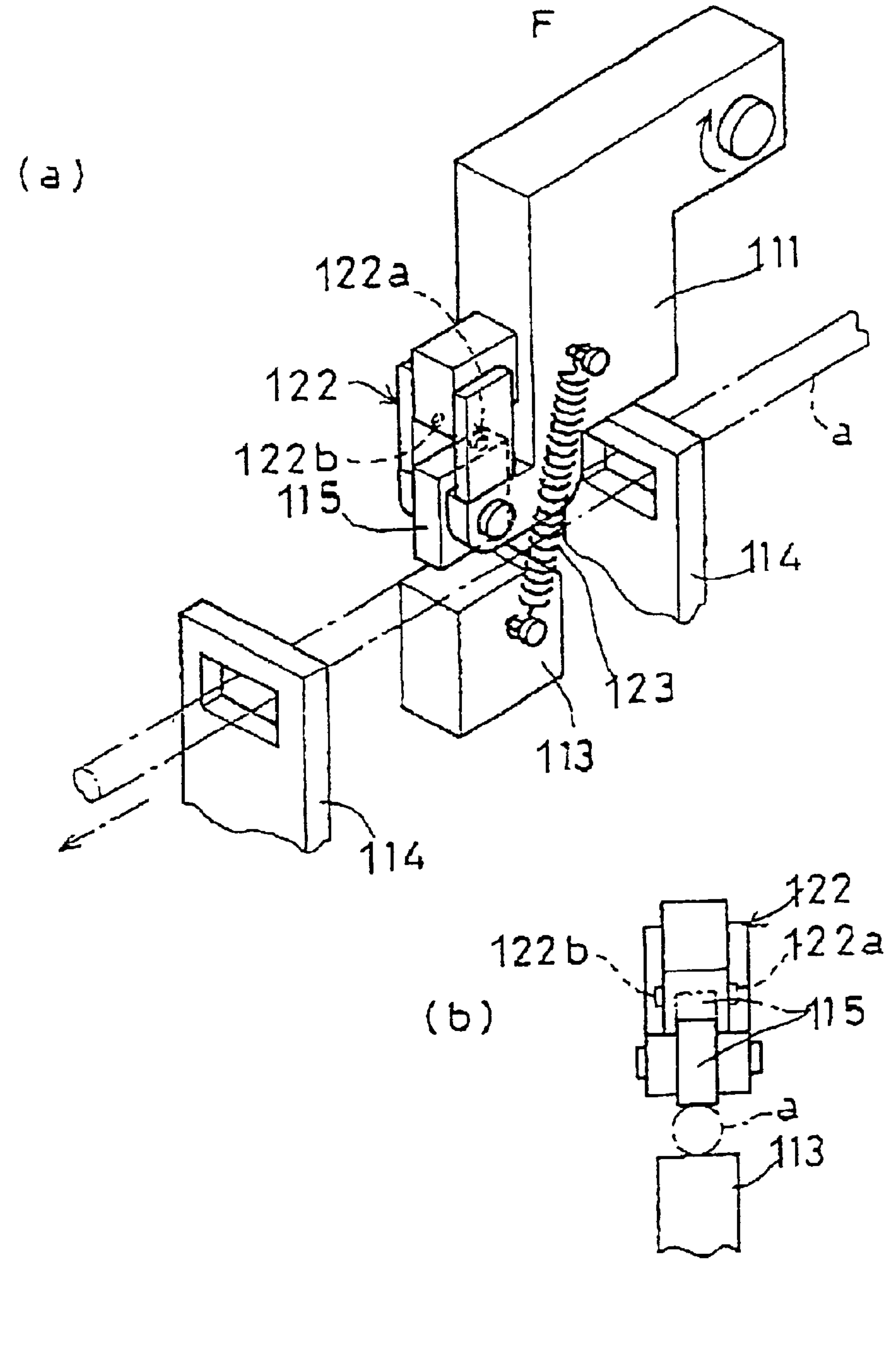
FIGS. 12(*a*) and 12(*b*) are a perspective view of another embodiment of the invention and a front view of a detecting section of this embodiment.
Figure 13:
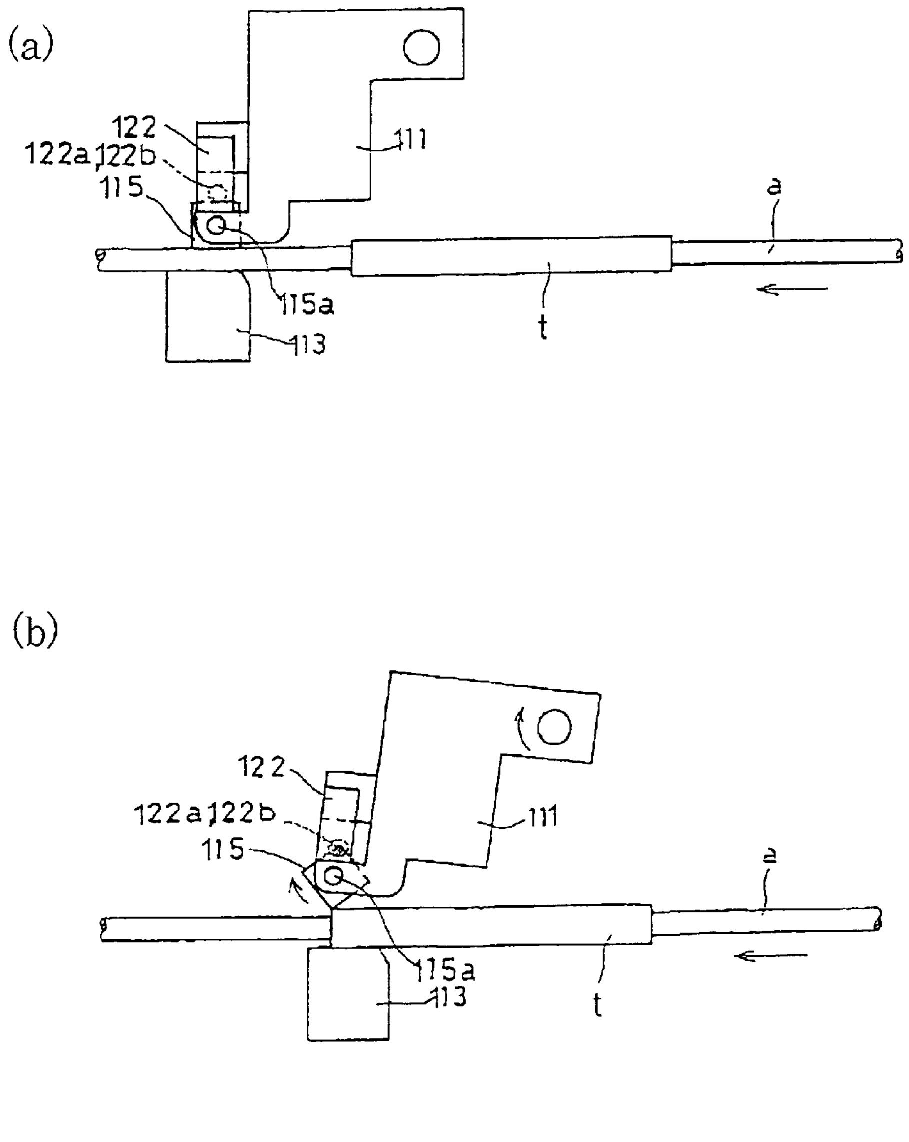
FIGS. 13(*a*) and 13(*b*) are diagrams showing how the embodiment of FIGS. 12(*a*) and 12(*b*) works.

FIGS. 12 and 13 show an embodiment in which a photoelectric switch 122 is used instead of the micro switch 112. In this embodiment, a spring 123 is provided between the operable plate 111 and the wire-contacting jig 113, so that the detector 115 can be held securely in sliding contact with the wire "a" by a biasing force of the spring 123. Further, the photoelectric switch 122 is comprised of a light detector 122*a* and a light emitter 122*b* mounted on the operable plate 111 with the detector 115 located therebetween.

Thus, while the wire "a" is running, the operable plate 111 is not pivoted or rotated upward as shown in FIG. 13 and, accordingly, light between the light detector 122*a* and the light emitter 122*b* of the photoelectric switch 122 is not blocked by the detector 115. If a joint formed e.g. by a tape t reaches the wire contacting jig 113 in this state, the detector 115 is rotated or pivoted as shown in FIG. 13(*b*) and in phantom in FIG. 12(*b*), thereby blocking the light between the light detector 122*a* and the light emitter 122*b*, as indicated by hatching in FIG. 13(*b*). As a result, the photoelectric switch 122 is actuated in response to a change in an amount of light detected thereby to detect the joint "t" of the wire "a".

Figure 14:
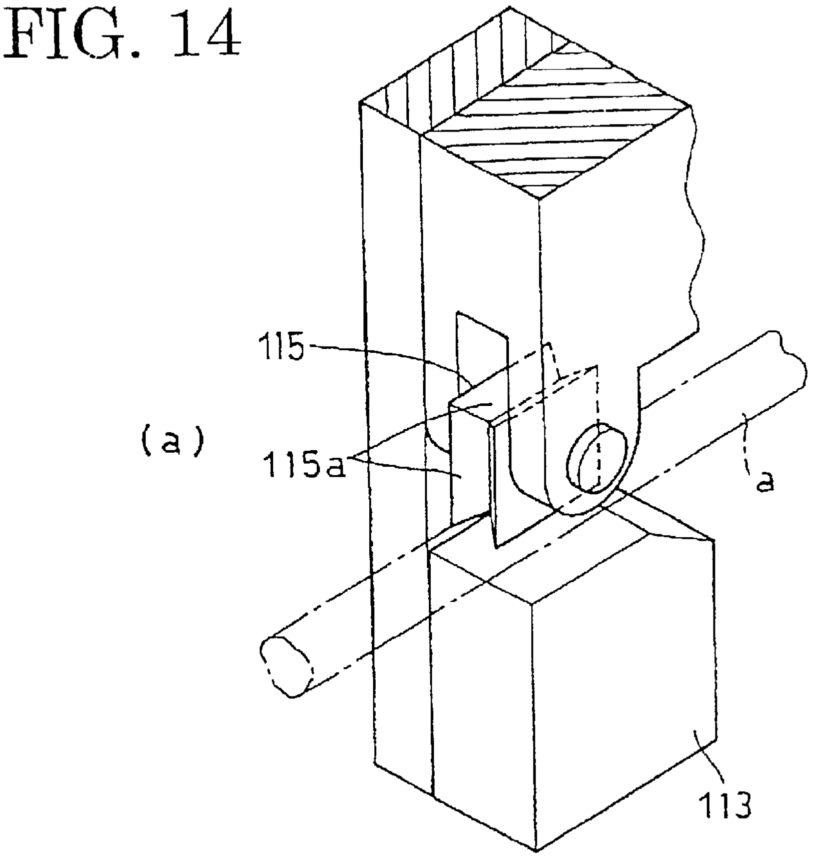
FIGS. 14(*a*) and 14(*b*) are a perspective view of an essential portion of another embodiment and a front view of a detecting section of the another embodiment.
Figure 14:
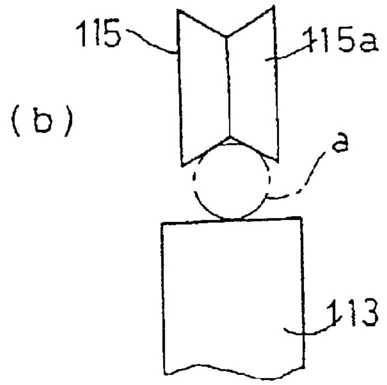
Figure 15:
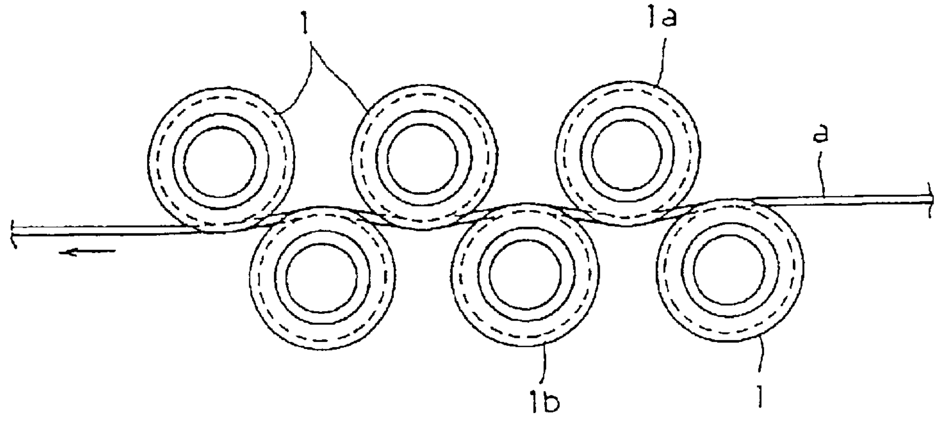
FIG. 15 PRIOR ART
FIG. 15 is a plan view of prior art wire joint detection.

Since a one-point contact is substantially established between the detector 115 and the wire "a" in cross section in the embodiment shown in FIG. 10(*b*), the step cannot be detected unless passing this point of contact. If the step is small, it may not be detected. Contrary to this, if a sliding-contact surface is provided by a V-shaped groove 115*a*, as shown in FIGS. 14(*a*) and 14(*b*), it comes into sliding contact with the step substantially at two positions in cross section, thereby improving a detection accuracy.

The operable plate 111 (detector 115) and the jig 113 may be electrically insulated from each other by making the frame F of an insulating plate such as a Bakelite plate. A voltage then may be applied between the plate 111 and the jig 113 to detect a joint formed by twisting conductors of the wires as described above. In other words, the joint can be detected by an electrical connection established between the detector 115 and the jig 113 by the joint t.

Although the joint is detected by the wound tape t in this embodiment, other known joints formed by twisting the conductors or mounting a sleeve can also be detected if there is a step.

Since the joint is detected by its step, as described above, it can be detected without any restriction factor, such as the exposure of the conductors.

What is claimed is:

1. A wire joint detecting apparatus, comprising:

a detector (115) disposed for sliding contact with a running wire (a), the detector being mounted for pivotal movement in response to cross sectional dimensional changes of the wire (a), and a detection switch (112; 122) for detecting the pivotal movement of the detector (115) to detect cross sectional dimensional changes of the wire (a) indicative of a joint (t).

2. A wire joint detecting apparatus according to claim 1, further comprising pivotally mounted an operable plate (111) on a frame (F), the detector switch (112) being engageable by pivotal mevement of the operable plate (111), the detector (115) that contacts the running wire (a) being pivotably mounted on the operable plate (111), and wherein the detector (115) is pivoted by a cross sectional dimensional change on the wire (a) by the joint (t), the operable plate (111) being pivoted by the pivoting of the detector (115) to actuate the detection switch (112), such that the joint (t) of the wire (a) is detected by a signal of the detection switch (112).

3. A wire joint detecting apparatus according to claim 1, wherein the detection switch is a photoelectric switch (122), and the joint (t) of the wire (a) is detected by a change in an amount of light detected by the photoelectric switch (122) resulting from the rotation of the detector (115).

4. A wire joint detecting apparatus according to claim 1, wherein a surface of the detector (115) to be held in sliding contact with the wire (a) is formed by a substantially V-shaped groove (115*a*) in which the wire (a) is at least partly fit.

* * * * *